(12) United States Patent
Suzuka et al.

(10) Patent No.: US 9,583,733 B2
(45) Date of Patent: Feb. 28, 2017

(54) ORGANIC ELECTROLUMINESCENT ELEMENT AND ILLUMINATION DEVICE

(71) Applicant: PANASONIC INTELLECTUAL PROPERTY MANAGEMENT CO., LTD., Osaka (JP)

(72) Inventors: Yuko Suzuka, Osaka (JP); Shin Okumura, Osaka (JP); Tsutomu Ichihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/904,800

(22) PCT Filed: Jun. 17, 2014

(86) PCT No.: PCT/JP2014/003239
§ 371 (c)(1),
(2) Date: Jan. 13, 2016

(87) PCT Pub. No.: WO2015/008431
PCT Pub. Date: Jan. 22, 2015

(65) Prior Publication Data
US 2016/0172626 A1    Jun. 16, 2016

(30) Foreign Application Priority Data
Jul. 19, 2013  (JP) ................................. 2013-151052

(51) Int. Cl.
H01L 51/52    (2006.01)

(52) U.S. Cl.
CPC ...... H01L 51/5259 (2013.01); H01L 51/5212 (2013.01); H01L 51/5246 (2013.01);
(Continued)

(58) Field of Classification Search
CPC ............ H01L 51/5259; H01L 51/5268; H01L 51/5275; H01L 51/5212; H01L 51/5246
See application file for complete search history.

(56) References Cited

U.S. PATENT DOCUMENTS 9,012,902 B2    4/2015   Ide et al.
2003/0116719 A1  6/2003  Miyazawa
(Continued)

FOREIGN PATENT DOCUMENTS

EP    1 079 666      2/2001
JP    2001-57287     2/2001
(Continued)

OTHER PUBLICATIONS

International Search Report in PCT/JP2014/003239, dated Aug. 19, 2014.

*Primary Examiner* — Douglas Menz
(74) *Attorney, Agent, or Firm* — Greenblum & Bernstein, P.L.C.

(57) ABSTRACT

An organic electroluminescent element is provided with a light transmissive substrate, a light transmissive electrode, a counter electrode paired with the light transmissive electrode, a sealing substrate facing the light transmissive substrate, an organic light emitting layer, and a resin structure. The organic light-emitting layer is disposed between the light transmissive electrode and the counter electrode. The organic light emitting layer is sealed with the light transmissive substrate and the sealing substrate. The resin structure is disposed between the light transmissive electrode and the light transmissive substrate. The resin structure is composed of a plurality of resin layers including a high refractive index layer and a low refractive index layer with different refractive indices. The high refractive index layer contains a physisorption-based moisture-absorbing material.

8 Claims, 4 Drawing Sheets

(52) U.S. Cl.
CPC ...... *H01L 51/5268* (2013.01); *H01L 51/5275* (2013.01); *H01L 2251/5361* (2013.01)

(56) References Cited

U.S. PATENT DOCUMENTS

| | | |
|---|---|---|
| 2005/0142379 A1 | 6/2005 | Juni et al. |
| 2005/0157367 A1 | 7/2005 | Miyazawa |
| 2009/0243474 A1 | 10/2009 | Kase et al. |
| 2011/0275271 A1 | 11/2011 | Kase et al. |
| 2013/0299812 A1 | 11/2013 | Hosokawa |
| 2015/0076477 A1 | 3/2015 | Kase et al. |

FOREIGN PATENT DOCUMENTS

| | | |
|---|---|---|
| JP | 2003-142262 | 5/2003 |
| JP | 2005-19300 | 1/2005 |
| JP | 2005-190931 | 7/2005 |
| JP | 2009-37808 | 2/2009 |
| JP | 2009-245708 | 10/2009 |
| JP | 2012-174410 | 9/2012 |
| WO | 2012/102268 | 8/2012 |

ORGANIC ELECTROLUMINESCENT ELEMENT AND ILLUMINATION DEVICE

TECHNICAL FIELD

The invention related to organic electroluminescent elements and illumination devices including organic electroluminescent elements is disclosed. Particularly, the invention related to an organic electroluminescent element in which an organic light-emitting layer is sealed and an illumination device is disclosed.

BACKGROUND ART

In recent years, organic electroluminescent elements (hereinafter also referred to as "organic EL elements") have been used in the applications of illumination panels or the like. Known has been an organic EL element in which a first electrode, an organic light-emitting layer composed of a plurality of layers including a light-emitting layer, and a second electrode paired with the first electrode are stacked on a surface of a first substrate such as a glass substrate in this order. In the organic EL element, a bottom emission structure in which light produced in the organic light-emitting layer is extracted outside through the first substrate or a top emission structure in which light is extracted outside through the opposite of the first substrate can be employed. In the organic EL element with the bottom emission structure, light produced in the organic light-emitting layer by applying voltage between the first electrode and the second electrode is extracted outside through the first electrode and the first substrate with light transmissive properties. It is also known to provide a light-outcoupling layer between the first electrode and the first substrate with light transmissive properties to increase light-outcoupling efficiency.

Since the organic light-emitting layer in the organic EL element can easily deteriorate due to moisture, it is important to prevent moisture from intruding to the inside of the organic EL element and to remove unprevented moisture. Deterioration of the organic light-emitting layer due to moisture causes light emission deficiency, leading to lowered reliability of the organic EL element.

Considering the above, in order to block moisture intrusion from outside, the first electrode, the organic light-emitting layer, and the second electrode are conventionally sealed with a second substrate which is bonded to the first substrate with an adhesive and thus shielded from outside.

However, there exists a problem that only providing the second substrate is not enough to completely block moisture intrusion from outside, since the adhesive used for bonding the first substrate and the second substrate may allow moisture to permeate.

When a substance with relatively high moisture permeability such as plastic is used as the light-outcoupling layer in the organic EL element with the bottom emission structure, there also exists a problem of moisture intrusion into the organic EL element through the substance.

JP 2003-142262 A discloses an organic EL display in which a seal layer and a resin layer containing a dispersed drying agent are formed between an electrode and a substrate. However, the organic EL element in this literature is sealed with the seal layer on the substrate and the resin layer granted with a sealing function due to a dispersed drying agent, which cannot adequately improve both of moisture prevention into the organic EL element and light-outcoupling efficiency at the same time.

SUMMARY OF INVENTION

An organic electroluminescent element and an illumination device below were invented to increase light-outcoupling efficiency and prevent moisture intrusion.

An organic electroluminescent element includes: a light transmissive substrate; a light transmissive electrode; a counter electrode paired with the light transmissive electrode; a sealing substrate facing the light transmissive substrate; an organic light-emitting layer; and a resin structure. The organic light-emitting layer is disposed between the light transmissive electrode and the counter electrode. The organic light-emitting layer is sealed with the light transmissive substrate and the sealing substrate. The resin structure is disposed between the light transmissive electrode and the light transmissive substrate. The resin structure is composed of a plurality of resin layers including a high refractive index layer and a low refractive index layer with different refractive indices. The high refractive index layer contains a physisorption-based moisture-absorbing material.

An illumination device includes the organic electroluminescent element and a wiring.

The electroluminescent element and the illumination device above have high light-outcoupling efficiency and can prevent moisture intrusion.

DESCRIPTION OF EMBODIMENTS

First Embodiment

Figure 1:
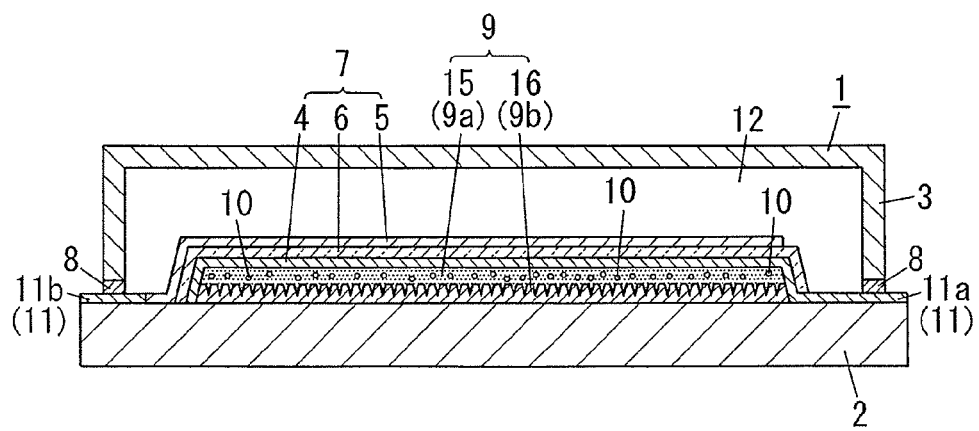
FIG. 1 is a schematic cross-sectional view illustrating an example of an organic electroluminescent element.

FIG. 1 illustrates an organic electroluminescent element (organic EL element) of the first embodiment. The organic EL element 1 includes: a light transmissive substrate 2; a light transmissive electrode 4; a counter electrode 5 paired with the light transmissive electrode 4; a sealing substrate 3 facing the light transmissive substrate 2; an organic light-emitting layer 6; and a resin structure 9. The organic light-emitting layer 6 is disposed between the light transmissive electrode 4 and the counter electrode 5. The organic light-emitting layer 6 is sealed with the light transmissive substrate 2 and the sealing substrate 3. The resin structure 9 is disposed between the light transmissive electrode 4 and the light transmissive substrate 2. The resin structure 9 is composed of a plurality of resin layers including a high refractive index layer 15 and a low refractive index layer 16 with different refractive indices. The high refractive index layer 15 contains a physisorption-based moisture-absorbing material 10. In FIG. 1, an electrode lead-out 11 of the light transmissive electrode 4 is illustrated on the right side, and an electrode lead-out 11 of the counter electrode 5 is illustrated on the left side.

This organic EL element 1 has a bottom-emission structure, and the light transmissive electrode 4 is supported by the light transmissive substrate 2. Moreover, the light transmissive electrode 4, the organic light-emitting layer 6, and the counter electrode 5 are stacked to form a light-emitting stack 7. The light-emitting stack 7 has a structure in which the light transmissive electrode 4, the organic light-emitting layer 6, and the counter electrode 5 are stacked in a thickness direction of the light-emitting stack 7 in this order from the light transmissive substrate 2. The light-emitting stack 7 is sealed with the light transmissive substrate 2 and the sealing substrate 3.

Figure 2:
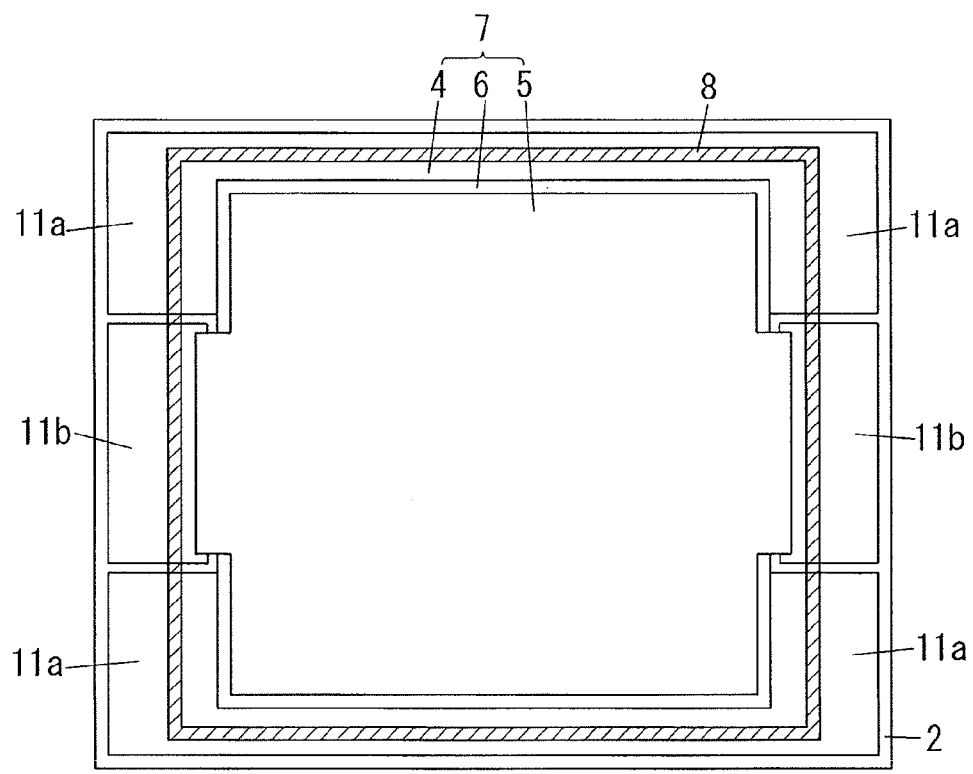
FIG. 2 is a plan view illustrating the example of the partially disassembled organic electroluminescent element.

FIG. 2 is a plan view from a direction vertical to a surface of the light transmissive substrate 2, illustrating the organic EL element 1 of the first embodiment with the sealing substrate 3 removed. As shown in FIG. 2, the light-emitting stack 7 is formed in a middle region of the light transmissive substrate 2 in a plan view (from a direction vertical to the surface of the substrate). The light-emitting stack 7 is sealed with the sealing substrate 3 bonded to the light transmissive substrate 2 at a peripheral region in a plan view surrounding the light-emitting stack 7. The light-emitting stack 7 is disposed within the sealed region.

The light transmissive substrate 2 is preferred to be a transparent substrate with a light transmissive property. The light transmissive substrate 2 may be a slightly colored substrate or a frosted glass substrate other than a colorless and transparent substrate. For example, the light transmissive substrate 2 may be made of a glass plate or a resin body. The glass plate, for example, may be a transparent glass plate such as a soda-lime glass plate and an alkali-free glass plate. The resin body, for example, may be a plastic film or a plastic plate made from resin such as polyester resin, polyolefin resin, polyamide resin, epoxy resin, and fluorine resin with an arbitrary method. The light transmissive substrate 2 is preferred to be made of a glass plate out of above named substances. Since glass has low moisture permeability, the light transmissive substrate 2 made of a glass plate can contribute to prevent moisture intrusion through the light transmissive substrate 2. Additionally, the light transmissive substrate 2 may have light diffusion effect by containing particles, powder, bubbles and the like which have refractive indices different from a refractive index of the main component constituting the light transmissive substrate 2. The light transmissive substrate 2 may have light diffusion effect also by having a pattern imprinted on its surface. The light transmissive substrate 2 may also have high thermal conductivity to reduce temperature rise caused by the heated element during a current flow. Furthermore, a moisture-proof layer may be formed on the surface of the light transmissive substrate 2 to prevent moisture intrusion and deterioration of the light-emitting stack 7.

The sealing substrate 3 can be formed of a substrate material with low moisture permeability. For example, a glass substrate such as a soda-lime glass substrate and an alkali-free glass substrate may be used for the sealing substrate 3. Since such glass materials are relatively low-priced, manufacturing cost of the organic EL element 1 can be reduced. The sealing substrate 3 may or may not have a recessed portion to accommodate the light-emitting stack 7. When the sealing substrate 3 has the recessed portion side surfaces of the light-emitting stack 7 can be covered with the sealing substrate 3. Therefore, moisture intrusion can be further prevented and sealing performance is improved. For example, cap glass can be used for the sealing substrate 3 with the recessed portion. On the other hand, when the sealing substrate 3 does not have the recessed portion, a flat surface of the sealing substrate 3 can be placed facing the light transmissive substrate 2 to seal the light-emitting stack 7. Thus, the sealing substrate 3 of a plate shape can be used as it is. However, when the sealing substrate 3 does not have the recessed portion, side walls which function as spacers to seal the light-emitting stack 7 need to be formed. Besides, the light transmissive substrate 2 and the sealing substrate 3 are preferred to be made of materials with same composition so that separation between the light transmissive substrate 2 and the sealing substrate 3 caused by heat and stress can be easily prevented.

As shown in FIG. 1, the sealing substrate 3 is bonded to the light transmissive substrate 2 with an adhesive material 8. The adhesive material 8 bonding the sealing substrate 3 to the light transmissive substrate 2 is provided on the light transmissive substrate 2, surrounding the peripheral region of the light-emitting stack 7. The light-emitting stack 7 is sealed and shielded from outside when the sealing substrate 3 is bonded to the light transmissive substrate 2 with the adhesive material 8. In FIG. 2, a region where the adhesive material 8 exists is illustrated with hatched lines.

The adhesive material 8 bonding the sealing substrate 3 to the light transmissive substrate 2 is composed of an appropriate material which functions as an adhesive. The adhesive material 8, for example, can be made from resin. The adhesive material 8 made from resin is preferred to have a moisture-proof property. For example, when the adhesive material 8 contains a drying agent, the moisture-proof property is enhanced and moisture intrusion through the adhesive material 8 can be prevented. The adhesive material 8 made of resin can be mainly composed of a material such as thermosetting resin and ultraviolet curing resin. A filler may be added to the adhesive material 8 so as to make an even film thickness of the adhesive material 8. Furthermore, a flexible element can be produced when thicknesses of the light transmissive substrate 2 and the sealing substrate 3 are made as thin as these substrates being bendable. When the glass substrate is used, the flexible element can be produced, for example, by making the thickness of the glass substrate smaller than or equal to 100 μm.

The light transmissive electrode 4 can be composed of a transparent electrode material. For example, conductive metal oxide can be preferably used. Transparent metal oxide may include ITO, IZO, and AZO. Conductive polymers such as PEDOT and polyaniline, conductive polymers doped with arbitrary accepters and the like, and conductive light transmissive materials such as carbon nanotubes may also be used. Other than the above, a metal material may be used in a form of a film with its thickness thin enough to retain transparency. When the metal material is used, the film thickness is preferred to be smaller than or equal to 10 nm to retain transparency. The light transmissive electrode 4 can be formed with, for example, the above mentioned electrode materials made into a thin film employing an appropriate method such as a vacuum deposition method, a spattering method, and a coating method. When the vacuum deposition method or the spattering method is employed, a film patterning using a mask can contribute to lowered manufacturing cost.

In addition, light transmissivity of the light transmissive electrode 4 is preferred to be higher than or equal to 70% in order for light produced in the organic light-emitting layer 6 to travel outside through the light transmissive electrode 4. Further, sheet resistance of the light transmissive electrode 4 is preferred to be smaller than or equal to some hundreds $\Omega/\square$ and especially preferred to be smaller than or equal to $100\Omega/\square$. The film thickness of the light transmissive electrode 4 may differ depending on materials but is preferred to be smaller than or equal to 500 nm and further preferred to be within a range of 10 to 200 nm. When the film thickness of the light transmissive electrode 4 lies within this range, properties of the light transmissive electrode 4, such as light transmissivity and sheet resistance, can be easily controlled as described above.

The counter electrode 5 can be composed of an appropriate electrode material. For example, it is preferred to use electrode materials such as metal, alloy, electrically conductive compounds, and mixtures thereof. Examples of the electrode materials include aluminum, silver, magnesium, and alloys of these metals and other metals such as magnesium-silver mixture, magnesium-indium mixture, and aluminum-lithium mixture. In addition, conductive metal materials, metal oxide, and mixture of these materials and other metals such as $Al/Al_2O_3$ mixture can be used. Materials described for the light transmissive electrode 4 may also be used. The counter electrode 5 can be formed with, for example, the above mentioned electrode materials made into a thin film employing an appropriate method such as a vacuum deposition method and a spattering method. The counter electrode 5 may have light reflectivity. When the counter electrode 5 has light reflectivity, light emitted from the light-emitting layer to the counter electrode 5 can be reflected at the counter electrode 5 and then extracted through the light transmissive substrate 2.

In the organic EL element, light is produced through recombination of a hole and an electron in the organic light-emitting layer 6 when voltage is applied between the light transmissive electrode 4 and the counter electrode 5. Therefore, electrode terminals, which are electrically conducted respectively to the light transmissive electrode 4 and the counter electrode 5, need to be formed outside the sealed region. The electrode terminals are terminals to be electrically connected to external electrodes. In the embodiment shown in FIG. 1, electrode lead-outs 11 are formed by extending a conductive layer constituting the light transmissive electrode 4 to ends of the light transmissive substrate 2. As shown in FIG. 1 and FIG. 2, the electrode lead-outs 11 include a first electrode lead-out 11a electrically connected to the light transmissive electrode 4 and a second electrode lead-out 11b electrically connected to the counter electrode 5. The first electrode lead-out 11a can be defined as a part of the light transmissive electrode 4 extended outside of the organic light-emitting layer 6 in a plan view. The second electrode lead-out 11b can be defined as a part of the conductive layer constituting the light transmissive electrode 4 divided by patterning and situated at an end of the light transmissive substrate 2. The second electrode lead-out 11b may be formed to be extended from the counter electrode 5 with same material thereof. In that case, the second electrode lead-out 11b can be defined as a part of the counter electrode 5 extended outside of the organic light-emitting layer 6. Either or both of the first electrode lead-out 11a and the second electrode lead-out 11b may also be formed with a conductive layer other than the conductive layer constituting the light transmissive electrode 4. Besides, electrode pads may be formed on surfaces of the electrode lead-outs 11 facing outside.

The organic light-emitting layer 6 produces light and generally includes a plurality of layers appropriately selected from a hole injection layer, a hole transport layer, a light-emitting layer, an electron transport layer, and electron injection layer, an interlayer, and the like. A thickness of the organic light-emitting layer 6 is not particularly limited but, for example, can be about 60 to 1000 nm.

A stack structure of the organic light-emitting layer 6 can be, for example, the hole injection layer, the hole transport layer, the light-emitting layer, the electron transport layer, and the electron injection layer stacked in this order from the light transmissive electrode 4, when the light transmissive electrode 4 functions as an anode and the counter electrode 5 functions as a cathode. The stack structure is not limited to the above and can be, for example, a single layer of the light-emitting layer, a stack of the hole transport layer, the light-emitting layer, and the electron transport layer, a stack of the hole transport layer and the light-emitting layer, or a stack of the light-emitting layer and the electron transport layer. Moreover, the light-emitting layer may have a single-layer structure or a multi-layer structure. For example, when the light produced is white, the light-emitting layer may be doped with dopant coloring matters of red, green and blue. The light-emitting layer may also be a stack of a blue hole-transporting light-emitting layer, a green electron-transporting light-emitting layer, and a red electron-transporting light-emitting layer, or a stack of a blue electron-transporting light-emitting layer, a green electron-transporting light-emitting layer, and a red electron-transporting light-emitting layer. Furthermore, the light-emitting layer may have a multi-unit structure of a plurality of directly and electrically connected light-emitting units stacked with interlayers having light transmissivity and conductivity therebetween. The light-emitting unit is defined as a stack structure disposed between paired electrodes so that light is produced when voltage is applied to the paired electrodes. In the multi-unit structure, a plurality of light-emitting units is stacked in a thickness direction between the paired electrodes (an anode and a cathode). Organic layers including the above mentioned materials may be formed into films with a dry film-forming process such as vapor deposition and transferring or wet film-forming processes such as spin-coating, spray-coating, die-coating, and gravure printing.

In a region where the light-emitting stack 7 is sealed with the light transmissive substrate 2 and the sealing substrate 3 (sealed internal space 12), sealed space of a cavity may be formed or a filler may be filled. When the sealed internal space 12 is a cavity, the light-emitting stack 7 can be sealed easily with the sealing substrate 3 and the organic EL element 1 can be readily manufactured. In this case, a drying agent is preferred to be provided in the sealed internal space 12 so that intruded moisture can be absorbed with the drying agent even if moisture intrudes into the sealed internal space 12. The drying agent can be, for example, attached to a surface of the sealing substrate 3 facing the light-emitting stack 7.

On the other hand, when the sealed internal space 12 is filled with the filler, the sealing substrate 3 and the light-emitting stack 7 are less likely to come into contact even when the sealing substrate 3 curves inward to the sealing internal space 12. Therefore, the organic EL element 1 can be manufactured more safely. The filler can be composed of a curable resin composition containing compounds such as a drying agent and a moisture-absorbing agent. When the filler contains the drying agent and the moisture-absorbing agent, moisture can be absorbed with the filler and prevented from reaching the organic light-emitting layer 6 even when moisture intrudes into the organic EL element 1. Additionally, the resin composition constituting the filler is preferred to have fluidity so that the sealed internal space 12 can be easily filled with the filler. The filler may or may not be curable.

The resin structure 9 can be formed with a resin composition. When the resin structure 9 is formed on a surface of the light transmissive substrate 2 facing the light-transmissive electrode 4, refractive indices can be easily adjusted with the resin structure 9 and light-outcoupling efficiency can be enhanced.

The resin structure 9 is composed of a plurality of resin layers. In the organic EL element 1 shown in FIG. 1, the resin structure 9 includes two resin layers. These resin layers are defined as a first resin layer 9a and a second resin layer 9b in this order from the sealing substrate 3. The resin structure 9 may be composed of more than two resin layers. The plurality of resin layers includes the high refractive index layer 15 and the low refractive index layer 16. The high refractive index layer 15 and the low refractive index layer 16 have different refractive indices. A refractive index of the high refractive index layer 15 is higher than that of the low refractive index layer 16. In an example shown in FIG. 1, the first resin layer 9a is the high refractive index layer 15, and the second resin layer 9b is the low refractive index layer 16. Note that, the first resin layer 9a may be the low refractive index layer 16 and the second resin layer 9b may be the high refractive index layer 15.

The high refractive index layer 15 and the low refractive index layer 16 in the resin structure 9 have a "high" refractive index and a "low" refractive index relative to each other. Moreover, the refractive index of the high refractive index layer 15 may be equal to or lower than that of the light transmissive electrode 4. The refractive index of the high refractive index layer 15 may be higher than that of the light transmissive electrode 4. In an example of a preferred relationship in refractive indices, the refractive indices of the low refractive index layer 16, the high refractive index layer 17, the light transmissive electrode 4, and the organic light-emitting layer 6 are increased in this order. In this case, light-outcoupling efficiency can be increased due to gradual change in the refractive indices.

A layer with a moisture-proof property may be provided on the light transmissive substrate 2, in addition to the high refractive index layer 15 and the low refractive index layer 16. When the layer with a moisture-proof property, the low refractive index layer 16, and the high refractive index layer 15 are stacked on the light transmissive substrate 2 in this order, the refractive index of the low refractive index layer 16 may be equal to or lower than that of the layer with a moisture-proof property, which can lead to prevention of total reflection between the layer with a moisture-proof property and the low refractive index layer 16. In this case, for example, the refractive index of the low refractive index layer 16 can be lower than that of the layer with a moisture-proof property and further, the refractive indices of the low refractive index layer 16, the high refractive index layer 15, the light transmissive electrode 4, and the organic light-emitting layer 6 can be increased in this order. The refractive index of the high refractive index layer 15 may be equal to or higher than that of the light transmissive electrode 4, which can lead to prevention of total reflection between the light transmissive electrode 4 and the high refractive index layer 15. In this case, for example, the refractive index of the low refractive index layer 16 can be lower than that of the layer with a moisture-proof property and further, the refractive index of the high refractive index layer 15 is higher than that of the light transmissive electrode 4.

At a layer interface between the high refractive index layer 15 and the light transmissive electrode 4, it is preferred for adjacent layers to have close refractive indices, and a difference in refractive indices of the adjacent layers are preferred to be small in order to reduce total reflection and improve light-outcoupling efficiency. Light produced in the light-emitting layer directly reaches or is reflected and reaches the light transmissive substrate 2. A large difference in refractive indices at the layer interface between the high refractive index layer 15 and the light transmissive electrode 4 makes it difficult to extract a large amount of light due to total reflection at the layer interface. On the other hand, the high refractive index layer 15 having the refractive index close to the refractive index of the light transmissive electrode 4 can be formed as a layer below the light transmissive electrode 4 (a layer closer to a light outcoupling side) to make the difference in refractive indices of the light transmissive electrode 4 and the high refractive index layer 15 small and further increase light-outcoupling efficiency. The difference in refractive indices of the light transmissive electrode 4 and the high refractive index layer 15 (the adjacent layers) is preferably small and can be, for example, smaller than or equal to 0.2 or 0.1 but is not limited thereto. Note that, when an uneven structure 13 is formed between the high refractive index layer 15 and the low refractive index layer 16, a certain level of difference in refractive indices between the high refractive index layer 15 and the low refractive index layer 16 may be acceptable since light is scattered and diffused at the layer interface between the high refractive index layer 15 and the low refractive index layer 16.

The difference in refractive indices between the high refractive index layer 15 and the low refractive index layer 16 is not particularly limited but, for example, can be set as larger than or equal to 0.1, larger than or equal to 0.5, larger than or equal to 1, or larger than or equal to 2. The refractive index of the low refractive index layer 16 is not particularly limited but can be within a range of 1.4 to 1.9. The refractive index of the high refractive index layer 15 is not particularly limited but can be within a range of 1.6 to 2.0. A difference in linear expansion coefficients between the low refractive index layer 16 and the high refractive index layer 15 is preferably small to prevent cracks.

The high refractive index layer 15 contains the physisorption-based moisture-absorbing material 10. The moisture-absorbing material 10 exists at least in the high refractive index layer 15. When the moisture-absorbing material 10 exists in the high refractive index layer 15, moisture can be absorbed closer to the organic light-emitting layer 6. Therefore, deterioration of the organic light-emitting layer 6 can be prevented effectively.

Materials which absorb moisture with physisorption such as, for example, silica gel, titanium oxide, aluminum oxide, magnesium oxide, zinc oxide, zeolite, and molecular sieve can be used for the moisture-absorbing material 10. When the resin structure 9 contains the moisture-absorbing material 10, moisture contained in the resin structure 9 is prevented from diffusing into the organic light-emitting layer 6 and a decrease in a light emission property can be prevented. Furthermore, when moisture intrudes from outside, the moisture-absorbing material 10 absorbs moisture to prevent the moisture from intruding into the organic light-emitting layer 6. Therefore, deterioration of the organic light-emitting layer 6 can be prevented.

In addition, since the physisorption-based moisture-absorbing material 10 is contained in the resin structure 9, the influence of moisture in manufacturing can also be suppressed. Moisture in the resin structure 9 can be evaporated by bake when resin is formed into a film. However, even after that, moisture may be absorbed into the resin structure 9 again if the resin structure 9 is left in an environment such as an atmosphere containing moisture. Besides, during washing process such as water washing in manufacturing the organic EL element 1, a large amount of washing water is absorbed in the resin structure 9, which may result in lowered moisture absorptivity of the moisture-absorbing material 10 before the organic light-emitting layer 6 is formed. On this account, it is important to vaporize moisture in the resin structure 9 as much as possible by bake again before the organic light-emitting layer 6 is formed so that moisture absorptivity of the moisture-absorbing material 10 is restored. When the physisorption-based moisture-absorbing material 10 is contained in the resin structure 9, moisture can be desorbed and absorbed reversibly and therefore moisture absorbed in the moisture-absorbing material 10 can be desorbed repeatedly. Chemisorption-based moisture-absorbing materials such as calcium oxide and barium oxide with chemical absorptivity are not preferred since moisture cannot be desorbed and absorbed reversibly. However, the physisorption-based moisture-absorbing material 10 and a moisture-absorbing material with chemical absorptivity may be used together.

The resin structure 9 may contain a dispersing material to disperse the moisture-absorbing material 10 evenly. When the resin structure 9 includes a plurality of layers containing the moisture-absorbing material 10, the dispersing material is preferred to be made of the same material in all the layers containing the dispersing material. In this way, the number of materials can be reduced and manufacturing cost can be further lowered. Note that, the dispersing materials contained in the layers may be made of different materials.

A particle size of the moisture-absorbing material 10 is, preferably, in a rage of 10 nm to 1 μm and, further preferably, in a range of 50 to 100 nm. When the particle size of the moisture-absorbing material 10 is smaller than or equal to 1 μm, total surface area of the moisture-absorbing material 10 can be increased and moisture absorptivity can be further enhanced. When the particle size of the moisture-absorbing material 10 is larger than or equal to 10 nm, the moisture-absorbing material 10 can be easily dispersed evenly in the resin layer.

A content of the moisture-absorbing material 10 in a total content of the high refractive index layer 15 is preferred to be 1 to 50% by weight and further preferred to be 10 to 20% by weight. When the content of the moisture-absorbing material 10 is lower than or equal to 50% by weight, light outcoupling efficiency of the resin structure 9 is not easily lowered and thus can be more enhanced. When the content of the moisture-absorbing material 10 is higher than or equal to 1% by weight, moisture absorptivity can be further increased. The content of the moisture-absorbing material 10 in a total content of the resin structure 9 is preferred to be 1 to 50% by weight and further preferred to be 10 to 20% by weight.

The refractive indices of the high refractive index layer 15 and the low refractive index layer 16 can be adjusted with an appropriate method. For example, the refractive indices can be lowered or heightened by dispersing low refractive particles or high refractive particles. For example, the refractive index of the high refractive index layer 15 can be heightened by dispersing the high refractive particles. The low refractive particles are, for example, silica microparticles. Especially, using porous silica particles is effective in lowering the refractive index. As for the high refractive particles, resin particles made of resin with a refractive index higher than that of a layer medium can be used. The refractive indices can also be adjusted by mixing voids in the resin structure 9. The refractive index can be lowered by mixing a lot of voids. When voids contain oxygen or water, the element easily deteriorates. Hence, voids are preferred not to contain oxygen or water but to be filled with, for example, inert gas (such as nitrogen).

In a preferred embodiment, the moisture-absorbing material 10 is the high refractive particles. When the high refractive index layer 15 contains the moisture-absorbing material 10 which is the high refractive particles, moisture absorptivity can be granted and the refractive index can be adjusted more efficiently. In the resin structure 9 containing the high refractive index layer 15 and the low refractive index layer 16, light can be scattered by reflection at an uneven interface and at surfaces of the particles or reflection and refraction due to a difference in refractive indices at an interface of different materials. The high refractive particles with moisture absorptivity such as, for example, titanium oxide, aluminum oxide, magnesium oxide, and zinc oxide are preferably used. These materials may be used alone or in combination. By using these materials, both of high refractivity and moisture absorptivity can be obtained at the same time. Thus, since particles with a high refractive index and a material with moisture absorptivity do not need to be used together, the number of materials can be reduced, thereby lowering manufacturing cost. Note that, the high refractive particles and the moisture-absorbing material 10 may be made of different materials.

The resin structure 9 is preferred to contain light-scattering particles. When the resin structure 9 contains the light-scattering particles, light entering into the resin structure 9 is scattered and hence more light can be extracted. A light-scattering particle may have a shape such as a rugby ball and a sphere. The light-scattering particles may be a mixture of particles with different shapes and sizes. The light-scattering particles may be contained in the high refractive index layer 15, the low refractive index layer 16, or both.

The moisture-absorbing material 10 is preferred to have a light-scattering property. That is, the light scattering particles are preferred to consist of the moisture-absorbing material 10. In this case, the number of materials can be reduced, leading to lowered manufacturing cost since the same material can be used for the moisture-absorbing material 10 and the light-scattering particles. Note that, different materials may be used for the moisture-absorbing material 10 and the light-scattering particles.

The moisture-absorbing material 10 is further preferred to have high refractivity and a light-scattering property. In this case, the same material can be used for the moisture-absorbing material 10, the high refractive particles for refractivity adjustment, and the light-scattering particles, leading to efficiently improved light-outcoupling efficiency and increased reliability. Note that, different materials may be used for the moisture-absorbing material 10, the high refractive particles, and the light-scattering particles.

A material with low light absorptivity is preferred to be used for the resin composition constituting the resin structure 9 in order to decrease loss of light when light travels through the resin structure 9. Loss of light can be decreased by setting an extinction coefficient (k) smaller than or equal to 0.05 especially in a luminescent wavelength region.

Furthermore, a thickness of the resin structure 9 is preferred to be less than or equal to 10 μm to further prevent light absorption.

Figure 3:
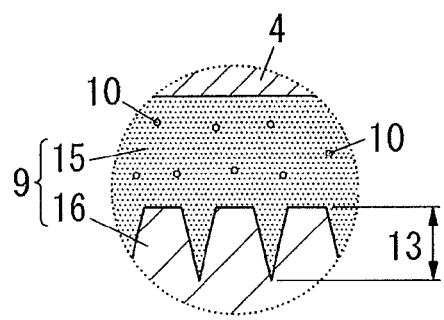
FIG. 3 is a schematic cross-sectional view illustrating an example of an uneven structure in a resin structure.

FIG. 3 illustrates an example of the uneven structure 13 provided in the resin structure 9. The resin structure 9 is preferred to have the uneven structure 13. The uneven structure 13 is preferred to be provided at an interface between the first resin layer 9a and the second resin layer 9b. Since light emitted from the light-emitting layer can be scattered by the uneven structure 13, loss of light due to total reflection can be decreased, resulting in further increased light-outcoupling efficiency.

The resin structure 9 (the high refractive index layer 15 and the low refractive index layer 16), for example, can be formed of the resin composition applied on the surface of the light transmissive substrate 2. Curable resin such as thermosetting resin and photosetting resin are preferred to be used for the resin constituting the resin composition. Thermoplastic resin may be also used. For example, acrylic resin, epoxy resin and phenol resin may be used as the resin. When the resin structure 9 is formed with coating, an appropriate method such as, for example, spin coating, slit coating, and ink jet can be employed. The material may also be applied using printing such as gravure printing and screen printing. The material can be easily applied in a pattern using an ink jet method and printing methods.

A plastic layer may also be used for the resin structure 9. The plastic layer can be formed with molded bodies (such as sheets and films) bonded together. The molded bodies are formed with synthetic resin, which is a material of plastic, molded and cured. The plastic layer can be made of a plastic material such as PET (polyethylene terephthalate) and PEN (polyethylene naphthalate). Acrylic resin and epoxy resin may also be used. A molding method of plastic is not particularly limited, and an appropriate molding method such as rolling molding, roll molding, and injection molding may be employed. When the plastic layer is used, the substrate of the plastic layer is preferred to have flexibility. When the substrate has flexibility, the plastic layer can be easily stacked by pasting the rolled substrate, which is being sent out sequentially, on the surface of the light transmissive substrate 2. A flexible element can also be produced when the substrate has flexibility. When a plastic sheet is used, the plastic layer can be formed with the plastic sheet bonded to the surface of the light transmissive substrate 2. Bonding can be performed using thermocompression or an adhesive. The plastic layer may be used for the high refractive index layer 15, the low refractive index layer 16, or both. The plastic layer with the high refractive index layer 15 and the low refractive index layer 16 prestacked may also be used.

When the uneven structure 13 is provided as shown in FIG. 3, the uneven structure 13 is formed with the first resin layer 9a and the second resin layer 9b stacked so that the interface therebetween is uneven. For example, after the second resin layer 9b is stacked, a surface of the second resin layer 9b is processed to become uneven, and then the first resin layer 9a is stacked on the second resin layer 9b. In this way, the uneven structure 13 can be easily formed. The uneven structure 13 can be also easily formed as following. The second resin layer 9b is stacked so that the second resin layer 9b has an uneven surface, and then the first resin layer 9a is stacked on the second resin layer 9b. The first resin layer 9a and the second resin layer 9b can be stacked by application of the resin composition. The uneven surface may be formed with processing such as stamping using an uneven stamper. The uneven structure may also be formed with imprinting. For example, the uneven surface with high light-outcoupling efficiency can be formed efficiently with optical imprinting.

The uneven structure 13 may also be formed with the first resin layer 9a and the second resin layer 9b stacked using a sheet. For example, the sheet should be prepared, in which the first resin layer 9a and the second resin layer 9b are prestacked so that the interface therebetween is uneven. When the sheet is bonded to the light transmissive substrate 2, the first resin layer 9a and the second resin layer 9b can be easily formed simultaneously. Alternatively, after an uneven sheet constituting the second resin layer 9b is bonded to the light transmissive substrate 2, the resin composition constituting the first resin layer 9a may be applied on the second resin layer 9b. Alternatively, after the resin composition constituting the second resin layer 9b is applied on the light transmissive substrate 2, an uneven sheet constituting the first resin layer 9a may be bonded to the second resin layer 9b. The uneven sheet means a sheet with an uneven surface. The uneven structure 13 can be easily formed using the sheet with the uneven surface.

When the uneven structure 13 is provided between the first resin layer 9a and the second resin layer 9b, the first resin layer 9a also functions as a layer planarizing the second resin layer 9b. When the second resin layer 9b is planarized, layers stacked on the light transmissive electrode 4 can be formed stably.

By the way, the uneven structure 13 may be provided at an interface between the light transmissive substrate 2 and the resin structure 9 or at an interface between the resin structure 9 and the light transmissive electrode 4. The uneven structure 13 may be provided at both of the interface between the light transmissive substrate 2 and the resin structure 9 and the interface between the resin structure 9 and the light transmissive electrode 4. When the resin structure 9 is composed of a plurality of layers, the uneven structure 13 may be provided on at least one of the interfaces between adjacent layers in the resin structure 9, between the light transmissive substrate 2 and the resin structure 9, and between the resin structure 9 and the light transmissive electrode 4.

When the uneven structure 13 is formed at the interface between the light transmissive substrate 2 and the resin structure 9, the surface of the light transmissive substrate 2 may be processed to become uneven using a method such as blasting and laser processing and then the resin composition constituting the resin structure 9 may be applied on the uneven surface to form the uneven structure 13. Alternatively, a sheet with the uneven structure 13 formed may be stacked on the flat surface of the light transmissive substrate 2. In this case, the sheet may be stacked on the light transmissive substrate 2 with the uneven surface of the sheet either facing the organic light-emitting layer 6 or being in contact with the light transmissive substrate 2. When the uneven surface of the sheet is stacked in contact with the light transmissive substrate 2, there exists some space at the interface between the light transmissive substrate 2 and the resin structure 9. The space preferably does not contain oxygen or water since the element easily deteriorates when oxygen or water is contained in the space. The space is preferred, for example, to be filled with inert gas (such as nitrogen).

On the other hand, when the uneven structure 13 is formed at the interface between the resin structure 9 and the light transmissive electrode 4, the uneven structure 13 can be formed with the resin structure 9, followed by processing to make the surface of the resin structure 9 uneven, stacked on the light transmissive substrate 2. In this case, the uneven surface may be formed with a method such as stamping using an uneven stamper or with imprinting. For example, the uneven structure 13 with high light-outcoupling efficiency can be formed efficiently with optical imprinting. Alternatively, the uneven structure 13 may be formed with the resin structure 9 stacked to have the uneven surface when the resin structure 9 is stacked on the light transmissive substrate 2.

As described, the uneven structure 13 can be formed within or on the surface of the resin structure 9. The uneven structure 13 may have a lens array structure. The lens array structure contains fine projections formed densely in a plane. The projections in the lens array structure may have shapes such as hemispherical shapes, pleated shapes, and pyramidal shapes (square pyramidal shapes). The uneven structure 13 may also have a diffraction structure. A thickness of the resin structure 9 is preferred to be less than or equal to 20 μm in order to preserve the uneven structure 13 and decrease light absorption. Furthermore, unevenness of the uneven structure 13 may be formed randomly. The unevenness may be nano sized.

Second Embodiment

Figure 4:
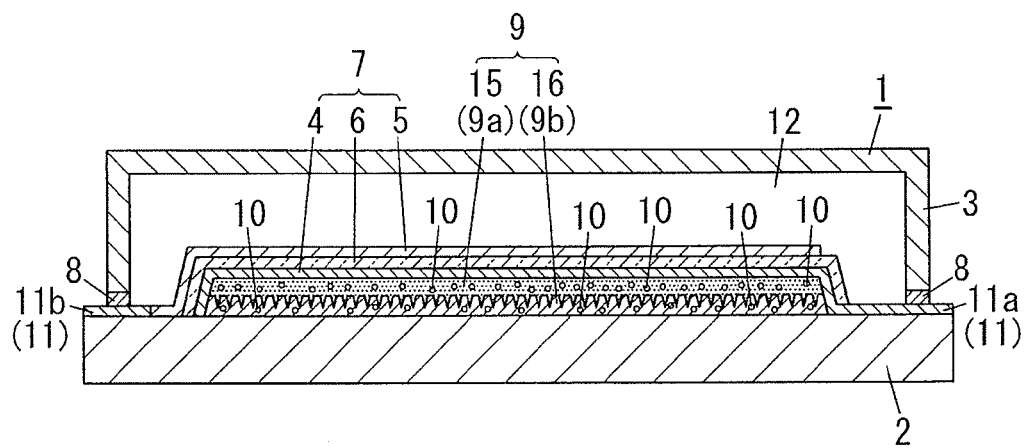
FIG. 4 is a schematic cross-sectional view illustrating an example of the organic electroluminescent element.

FIG. 4 illustrates an organic EL element of the second embodiment. The second embodiment differs from the first embodiment in terms of the low refractive index layer 16 and otherwise both embodiments may be same. Same components as in the first embodiment are referred to the same signs and explanation is omitted.

In the organic EL element 1 of the second embodiment, a moisture-absorbing material 10 is contained in both of a high refractive index layer 15 and a low refractive index layer 16. When the moisture-absorbing material 10 is also contained in the low refractive index layer 16, moisture absorptivity is increased and deterioration of the element is further prevented.

The moisture-absorbing material 10 contained in the low refractive index layer 16 may or may not be same as the moisture-absorbing material 10 contained in the high refractive index layer 15. When the same moisture-absorbing material 10 is contained, the number of materials can be reduced. When the different moisture-absorbing materials 10 are contained, a property appropriate for each layer can be granted.

The moisture-absorbing material 10 contained in the low refractive index layer 16 may have a light-scattering property. In this case, the light-scattering property enhances light-outcoupling efficiency. The moisture-absorbing material 10 contained in the low refractive index layer 16 may be low refractive particles. In this case, the moisture-absorbing material 10 contained in the low refractive index layer 16 is preferred to be different from the moisture-absorbing material 10 contained in the high refractive index layer 15.

A concentration of the moisture-absorbing material 10 in the low refractive index layer 16 may be around same as a concentration of the moisture-absorbing material 10 in the high refractive index layer 15 and for example, may be within 0.9 to 1.1 times of the concentration of the moisture-absorbing material 10 in the high refractive index layer 15. The concentrations are based on weight.

Third Embodiment

Figure 5:
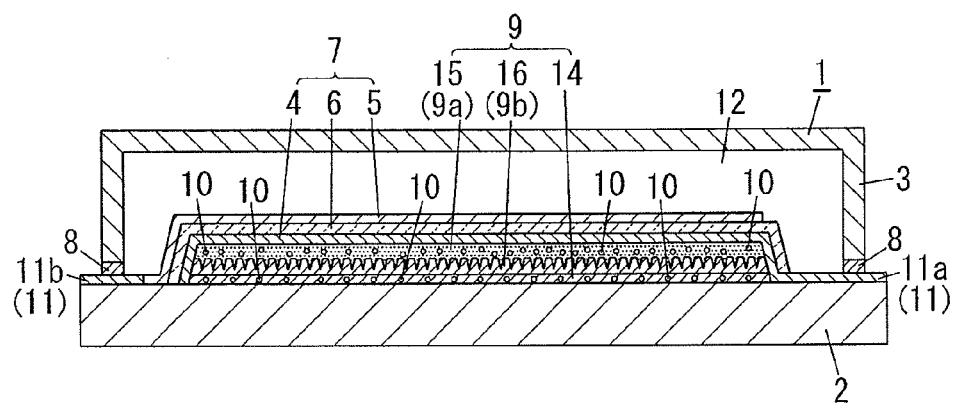
FIG. 5 is a schematic cross-sectional view illustrating an example of the organic electroluminescent element.

FIG. 5 illustrates an organic EL element of the third embodiment. The third embodiment differs from the first embodiment in terms of the resin structure 9 and otherwise both embodiments may be same. Same components as in the first embodiment are referred to the same signs and explanation is omitted.

In the organic EL element 1 of the third embodiment, a resin structure 9 includes an adhesion layer 14 to increase adhesiveness between the resin structure 9 and a light transmissive substrate 2. The adhesion layer 14 is disposed closer to the light transmissive substrate 2 in the resin structure 9.

In the organic EL element 1, when thermal stress differs between the plurality of layers stacked on the light transmissive substrate 2, peeling and cracks may tend to occur at the layer interface. Especially, in manufacturing the organic EL element 1, following the formation of the resin structure 9, a light transmissive electrode 4 and an organic light-emitting layer 6 might be stacked under a relatively higher temperature than when the resin structure 9 is formed. Therefore, under the above condition, peeling and cracks tend to occur. Thus, the resin structure 9 is preferred to be composed of the plurality of layers and include the adhesion layer 14 closer to the light transmissive substrate 2. When the resin structure 9 includes the adhesion layer 14, peeling and cracks tend not to occur easily at the layer interface between the light transmissive substrate 2 and the resin structure 9 even when heated during manufacturing the organic EL element 1. Hence the organic EL element 1 with excellent electric connection performance and high reliability can be produced. Additionally, thermal stress due to heat produced in the organic EL element 1 under operation can be distributed leading to reduced occurrence of peeling and cracks and prevention of short-circuit failure.

When a thermal expansion coefficient of the resin structure 9 is larger than that of the light transmissive substrate 2, the resin structure 9 drags the light transmissive substrate 2 strongly when heated, leading to possible peeling and cracks. On this account, for example, a thermal expansion coefficient of the adhesion layer 14 is preferred to be set between that of a second resin layer 9b and that of the light transmissive substrate 2, which can further prevent peeling and cracks.

A material with low light absorptivity is preferred to be used for the adhesion layer 14 to reduce loss of light traveling therethrough. Loss of light can be reduced by setting the extinction coefficient (k) less than or equal to 0.05 especially in the luminescent wavelength region. Besides, a thickness of the adhesion layer 14 is preferred to be thin in order to prevent light absorption. The thickness of adhesion layer 14 is preferred to be less than or equal to 1 μm to further prevent light absorption. Furthermore, when a silane coupling agent is used as the material of the adhesion layer 14, the adhesion layer 14 can be a monomolecular layer and thus the thickness of the adhesion layer 14 can be as thin as less than or equal to some nm, leading to drastic prevention of light absorption.

The adhesion layer 14 does not need to contain a physisorption-based moisture-absorbing material 10 but is preferred to contain the physisorption-based moisture-absorbing material 10. In FIG. 5, the moisture-absorbing material 10 contained in the adhesion layer 14 is shown. When the moisture-absorbing material 10 exists in the adhesion layer 14 which is physically far from the organic light-emitting layer 6, moisture is absorbed at a position far from the organic light-emitting layer 6. Hence, moisture is prevented from spreading into the organic light-emitting layer 6 and the light emission property can be prevented from deterioration.

Incidentally, a high refractive index layer 15 is influenced by the moisture-absorbing material 10 in terms of refractivity. A low refractive index layer 16 is influenced by the moisture-absorbing material 10 in terms of refractivity when the low refractive index layer 16 contains the moisture-absorbing material 10. Due to this, the moisture-absorbing material 10 might restrict the adjustment of refractivity in the high refractive index layer 15 and the low refractive index layer 16. On the other hand, when the moisture-absorbing material 10 is contained in the adhesion layer 14, the adjustment of refractivity in the layers is easily performed since the amount of the moisture-absorbing material 10 in the high refractive index layer 15 can be reduced and the amount of the moisture-absorbing material 10 in the low refractive index layer 16 can be reduced even to 0.

In FIG. 5, the physisorption-based moisture-absorbing material 10 is contained in the adhesion layer 14 and the high refractive index layer 15. The moisture-absorbing material 10 contained in the high refractive index layer 15 and the moisture-absorbing material 10 contained in the adhesion layer 14 may contain different materials but are preferred to contain the same material. When the same material is used, the number of material can be reduced, leading to lowered manufacturing cost.

When the physisorption-based moisture-absorbing material 10 is also contained in the adhesion layer 14, a concentration of the moisture-absorbing material 10 in the high refractive index layer 15 is preferred to be larger than a concentration of the moisture-absorbing material 10 in the adhesion layer 14. In this case, moisture intruded close to the organic light-emitting layer 6 can be absorbed efficiently, resulting in efficient prevention of deterioration. When the moisture-absorbing material 10 has high refractivity, refractivity of the high refractive index layer 15 can be increased and thus light-outcoupling efficiency can be improved.

The moisture-absorbing material 10 may or may not be contained in the low refractive index layer 16. When the moisture-absorbing material 10 is not contained in the low refractive index layer 16, manufacturing cost can be lowered and moisture absorptivity can be obtained more efficiently. On the other hand, when the moisture-absorbing material 10 is contained in the low refractive index layer 16, moisture absorptivity can be enhanced.

Note that, the first resin layer 9a is the high refractive index layer 15 and the second resin layer 9b is the low refractive index layer 16 in FIG. 5, but the reverse is also acceptable.

Fourth Embodiment

Figure 6:
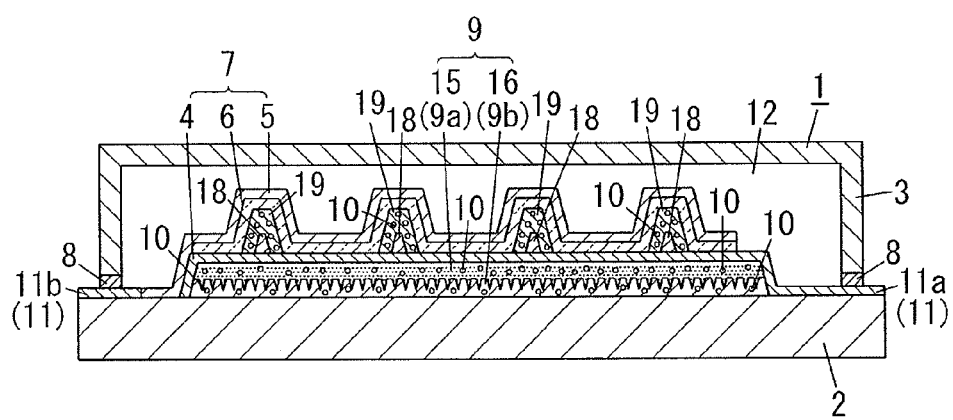
FIG. 6 is a schematic cross-sectional view illustrating an example of the organic electroluminescent element.

FIG. 6 illustrates an organic EL element of the fourth embodiment. The fourth embodiment differs from the first embodiment in terms of an auxiliary electrode 18 and an insulation film 19 and otherwise both embodiments may be same. Same components as in the first embodiment are referred to the same signs and explanation is omitted. The embodiment shown in FIG. 6 is an example of the auxiliary electrode 18 and the insulation film 19 provided in the embodiment of FIG. 4. Note that, the embodiment provided with the auxiliary electrode 18 and the insulation film 19 can be applied to the embodiments shown in FIG. 1 and FIG. 5. In FIG. 6, a first resin layer 9a is a high refractive index layer 15 and a second resin layer 9b is a low refractive index layer 16, but the reverse is also acceptable.

The organic EL element 1 of the fourth embodiment includes the auxiliary electrode 18 and the insulation film 19. The auxiliary electrode 18 is in contact with the light transmissive electrode 4. The auxiliary electrode 18 is composed of a conductive material arranged linearly. The insulation film 19 is disposed at a position overlapping with the auxiliary electrode 18 in a plan view between the auxiliary electrode 18 and an organic light-emitting layer 6. The insulation film 19 contains a moisture-absorbing material 10.

The auxiliary electrode 18 is provided linearly on the surface of the light transmissive electrode 4. Since the light transmissive electrode 4 is formed with a transparent material (such as transparent metal oxide), the light transmissive electrode 4 generally has high resistivity and low conductivity. On this account, when the auxiliary electrode 18 is formed with electrode wiring composed of the conductive material having lower resistivity and higher conductivity than the light transmissive electrode 4, conductivity of the light transmissive electrode 4 can be supplemented and improved. Therefore, current distribution on a light-emitting surface is improved and the organic EL element 1 with even light emission on the light-emitting surface can be obtained. Moreover, since the auxiliary electrode 18 is formed on the surface of the light transmissive electrode 4, the auxiliary electrode 18 can indirectly put a pressing force on the resin structure 9 through the light transmissive electrode 4. Thus, expansion when heated can be suppressed, leading to lower occurrence of cracks at the layer interface. Note that, in FIG. 6, the auxiliary electrode 18 and the insulation film 19 are stacked in this order, following the light transmissive electrode 4 stacked on the resin structure 9, but the light transmissive electrode 4 and the insulation film 19 may be stacked in this order, following the auxiliary electrode 18 stacked on the resin structure 9.

The auxiliary electrode 18 may be arranged in a shape such as a mesh and a lattice. The auxiliary electrode 18 arranged in a lattice shape is called a grid electrode. The auxiliary electrode 18 arranged in the lattice shape contributes to more uniform current distribution. When the auxiliary electrode 18 is arranged in a mesh shape, light can be to the light transmissive substrate 2 extracted through openings of the mesh formed with the auxiliary electrode 18.

Figure 7:
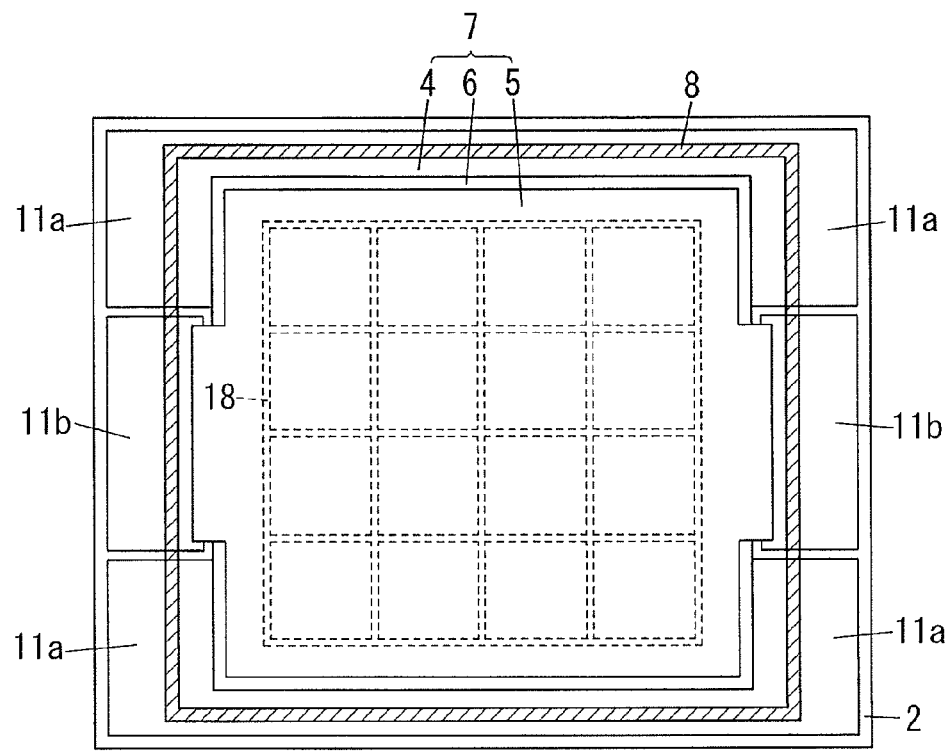
FIG. 7 is a plan view illustrating the example of the partially disassembled organic electroluminescent element.

FIG. 7 illustrates a plan view of the partially disassembled organic electroluminescent element in the fourth embodiment. The auxiliary electrode 18 is illustrated with dashed lines. In FIG. 7, the auxiliary electrode 18 is arranged in the lattice shape.

The auxiliary electrode 18 is a layer composed of the conductive material and does not need to have transparency. The auxiliary electrode 18, for example, can be formed with a conductive metal material, specifically, such as copper, silver, gold, aluminum, nickel, and molybdenum. One of preferred materials of the auxiliary electrode 18 is molybdenum/aluminum/molybdenum stack (Mo/Al/Mo) also known as MAM. When MAM is used for the auxiliary electrode 18, reliability can be improved due to high adhesiveness between the auxiliary electrode 18 and the light transmissive electrode 4 at the same time with conductivity of the light transmissive electrode 4 being effectively supplemented and improved.

By the way, since the auxiliary electrode 18 generally does not have transparency, light cannot be extracted at a region where the auxiliary electrode 18 is disposed, leading to formation of a non-light-emitting region along the shape of the auxiliary electrode 18. On this account, the resin structure 9 is preferred to have an uneven structure 13 when the auxiliary electrode 18 is provided. The uneven structure 13 scatters light and thus light can be scattered in the non-light-emitting region formed with the auxiliary electrode 18. Hence, more natural light emission can be achieved by making the non-light-emitting region due to the auxiliary electrode 18 lost or unnoticeable.

When width of the auxiliary electrode 18 is made wider, although more uniform current distribution is obtained, a total area of the openings of the mesh formed with the auxiliary electrode 18 is decreased. Due to this, a driving current density needs to be high in order to obtain sufficient light emission intensity, which results in a decreased life span of the organic EL element 1. An area of the auxiliary electrode 18 to a light-emitting area is preferred to be less than or equal to 10% to keep a sufficient life span of the organic EL element 1. Additionally, the width of the auxiliary electrode 18 is preferred to be within 10 to 50 μm and pitch of the lattice is preferred to be larger than or equal to 200 μm. With the width of the auxiliary electrode 18 and the pitch of the lattice being within the above ranges, the sufficient life span of the organic EL element 1 is ensured and uniform current density is obtained.

It is preferred to provide the insulation film 19 between the organic light-emitting layer 6 and the auxiliary electrode 18. The insulation film 19 is preferred to be provided at a position overlapping with the auxiliary electrode 18 in a plan view. When the insulation film 19 is provided on the surface of the auxiliary electrode 18, the insulation film 19 can indirectly put a pressing force on the first resin layer 9a and the second resin layer 9b through the light transmissive electrode 4, thereby preventing thermal expansion when heated and lowering occurrence of cracks. Further, since the auxiliary electrode 18 is formed, being swollen on the surface of the light transmissive electrode 4, formation of the organic light-emitting layer 6 and the counter electrode 5 directly on the surface of the auxiliary electrode 18 may cause the layers cut or made thin, further leading to electrical short-circuit failure. However, when the insulation film 19 is provided, the auxiliary electrode 18 is electrically insulated with the insulation film 19. Thus, even when the counter electrode 5 is stacked on the auxiliary electrode 18, the auxiliary electrode 18 and the counter electrode 5 do not come in contact directly due to the insulation film 19, thereby preventing electrical short-circuit failure. Note that, when the light transmissive electrode 4 is formed on the auxiliary electrode 18, the insulation film 19 is provided between the light transmissive electrode 4 and the organic light-emitting layer 6. A material for the insulation film 19 is not particularly limited but, for example, can be novolac resin, acrylic resin, and polyimide.

Since the auxiliary electrode 18 generally does not have light transmissivity, light cannot be extracted through the region where the auxiliary electrode 18 is formed. Thus, when light is emitted in this region, loss of light emission occurs and light emission efficiency might decrease. However, when the insulation film 19 is provided as in the present embodiment, light is not produced at the region where the auxiliary electrode 18 is formed, so that more current can flow in a region (the openings of the mesh), where the auxiliary electrode 18 is not formed and where light can be extracted. In this way, loss of light emission can be reduced and light emission efficiency can be improved.

The insulation film 19 may be formed in almost the same pattern as the auxiliary electrode 18. In another words, the insulation film 19 may be formed in a shape such as lines, a mesh, and a lattice.

The insulation film 19 is preferred to contain the physisorption-based moisture-absorbing material 10. For example, materials which absorb moisture with physisorption such as silica gel, titanium oxide, aluminum oxide, magnesium oxide, zinc oxide, zeolite, and molecular sieve can be used for the moisture-absorbing material 10. With the insulation film 19 containing the moisture-absorbing material 10, moisture in the insulation film 19 is prevented from diffusing into the organic light-emitting layer 6 and hence the light emission property can be prevented from being impaired. Moreover, when moisture intrudes from outside, moisture is absorbed with the moisture-absorbing material 10 before moisture intrudes into the organic light-emitting layer 6 and hence deterioration of the organic light-emitting layer 6 can be prevented. The moisture-absorbing material 10 used in the insulation film 19 is preferred to be same as the moisture-absorbing material 10 used in the resin structure 9. When the same material is used, the number of materials can be reduced, thereby lowering cost of manufacturing. Note that, different material may be used for the moisture-absorbing material 10 contained in the insulation film 19 and the moisture-absorbing material 10 contained in the resin structure 9.

Moisture in the insulation film 19 can be evaporated by bake when the insulation film 19 is formed. However, even after that, moisture may be absorbed into the insulation film 19 again if the insulation film 19 is left in an environment such as the atmosphere containing moisture. Besides, during washing process such as water washing in manufacturing the organic EL element 1, a large amount of washing water is absorbed in the insulation film 19, which may result in lowered moisture absorptivity of the moisture-absorbing material 10 before the organic light-emitting layer 6 is formed. On this account, it is important to vaporize moisture in the insulation film 19 as much as possible by bake again before the organic light-emitting layer 6 is formed so that moisture absorptivity of the moisture-absorbing material 10 is restored. When the physisorption-based moisture-absorbing material 10 is contained in the insulation film 19, moisture can be desorbed and absorbed reversibly and therefore moisture absorbed in the moisture-absorbing material 10 can be desorbed repeatedly. Chemisorption-based moisture-absorbing materials such as calcium oxide and barium oxide are not preferred since moisture cannot be desorbed and absorbed reversibly. Furthermore, the insulation film 19 may contain a dispersing material to disperse the moisture-absorbing material 10 evenly.

In the present embodiment, when the uneven structure 13 is provided in the resin structure 9, the auxiliary electrode 18 is preferred to be formed in a region of the resin structure 9 where the uneven structure 13 is not formed in a plan view. In this way, a flat film can easily be formed, leading to uniform film quality and improved stability of the auxiliary electrode 18. Furthermore, a film stacked on the auxiliary electrode 18 is also stabilized, thereby preventing electrical short-circuit failure and stabilizing current density distribution, which results in improved reliability. When the auxiliary electrode 18 is formed, patterning may be performed, following the formation of the auxiliary electrode 18 on the whole substrate. A pattern may be formed optically with patterning such as mask exposure and laser patterning. In optical patterning, since diffused reflection of light is caused by the uneven structure 13 irradiated with a light source for patterning, a patterning blur occurs at a pattern edge. On the other hand, when the auxiliary electrode 18 is not formed on the uneven structure 13, a patterning blur does not occur and thus patterning precision is improved. A distance between the uneven structure 13 and an end of the auxiliary electrode 18 is preferred to be greater than or equal to 1 μm. In this case, a patterning blur is less likely to occur.

(Illumination Device)

The illumination device includes the organic EL element 1 described above. Therefore, the illumination device which prevents moisture intrusion with high light-outcoupling efficiency and high reliability can be obtained. A plurality of organic EL elements 1 can be disposed in plane to constitute the illumination device. The illumination device may include a wiring structure to supply electricity to the organic EL element 1. The illumination device may include a body to support the organic EL element 1. The illumination device may include a plug to electrically connect the organic EL element 1 and a power supply. The illumination device may be a panel. Since a thickness of the illumination device can be small, a space-saving illumination apparatus can be provided.

Figure 8:
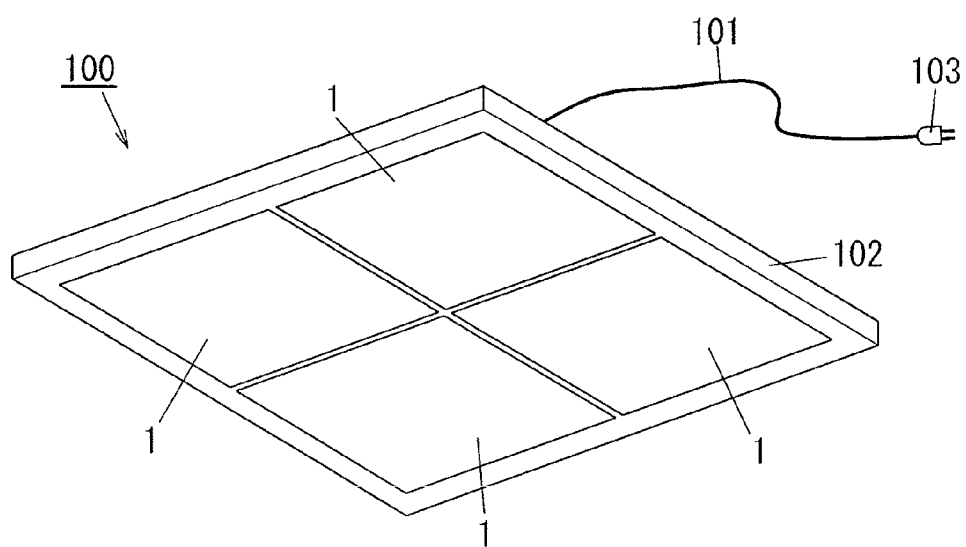
FIG. 8 is a schematic perspective view illustrating an example of an illumination device.

FIG. 8 illustrates an example of the illumination device. The illumination device 100 includes the organic EL element 1, the body 102, the plug 103, and the wiring 101. In FIG. 8, the plurality of (four) organic EL elements 1 are disposed in plane. The organic EL elements 1 are housed in the body 102. The organic EL elements 1 emit light when electricity is supplied through the plug 103 and the wiring 101, and then light is emitted from the illumination device 100.

The invention claimed is:

1. An organic electroluminescent element comprising:
 a light transmissive substrate;
 a light transmissive electrode;
 a counter electrode paired with the light transmissive electrode;
 a sealing substrate facing the light transmissive substrate;
 an organic light-emitting layer disposed between the light transmissive electrode and the counter electrode and sealed with the light transmissive substrate and the sealing substrate; and
 a resin structure disposed between the light transmissive electrode and the light transmissive substrate and composed of a plurality of resin layers including a high refractive index layer and a low refractive index layer with different refractive indices,
 the high refractive index layer containing a physisorption-based moisture-absorbing material.

2. The organic electroluminescent element according to claim 1, wherein
 the moisture-absorbing material is high refractive index particles.

3. The organic electroluminescent element according to claim 1, wherein
 the moisture-absorbing material has a light scattering property.

4. The organic electroluminescent element according to claim 1, wherein
 the resin structure includes an uneven structure.

5. The organic electroluminescent element according to claim 1, wherein
 the resin structure includes an adhesion layer which increases adhesiveness between the resin structure and the light transmissive substrate.

6. The organic electroluminescent element according to claim 5, wherein:
 the adhesion layer contains a physisorption-based moisture-absorbing material; and
 a concentration of the moisture-absorbing material in the high refractive index layer is higher than a concentration of the moisture-absorbing material in the adhesion layer.

7. The organic electroluminescent element according to claim 1, further comprising:
 an auxiliary electrode arranged linearly and contacting the light transmissive electrode, and composed of a conductive material; and
 an insulation film disposed at a position overlapping with the auxiliary electrode in a plan view between the auxiliary electrode and the organic light-emitting layer, the insulation film containing a physisorption-based moisture-absorbing material.

8. An illumination device comprising:
 the organic electroluminescent element according to claim 1; and
 a wiring.

* * * * *